(12) United States Patent
Abiko

(10) Patent No.: US 6,544,827 B2
(45) Date of Patent: Apr. 8, 2003

(54) METAL-GATE FIELD EFFECT TRANSISTOR AND METHOD FOR MANUFACTURING THE SAME

(75) Inventor: Hitoshi Abiko, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/895,168

(22) Filed: Jul. 2, 2001

(65) Prior Publication Data
US 2001/0038136 A1 Nov. 8, 2001

Related U.S. Application Data

(62) Division of application No. 09/379,359, filed on Aug. 23, 1999.

(30) Foreign Application Priority Data

Aug. 24, 1998 (JP) .............................. 10-237769

(51) Int. Cl.⁷ ............................................ H01L 21/338
(52) U.S. Cl. ........................ 438/183; 438/276; 438/289; 438/290
(58) Field of Search ................................ 438/276, 289, 438/290, 275, 279, 183, 184, 185, 592, 683; 257/768, 757, 720

(56) References Cited

U.S. PATENT DOCUMENTS 5,960,270 A * 9/1999 Misra et al. ............... 438/197
6,072,221 A * 6/2000 Hieda ........................ 257/382
6,080,648 A   6/2000 Nagashima

FOREIGN PATENT DOCUMENTS

| JP | 2-3244 | 1/1990 |
|----|--------|--------|
| JP | 4-123439 | 4/1992 |
| JP | 6-53237 | 2/1994 |
| JP | 7-231092 | 8/1995 |
| JP | 10-172922 | 6/1998 |
| JP | 10/198866 | 7/1998 |
| JP | 10-200096 | 7/1998 |
| JP | 63-248172 | 10/1998 |

OTHER PUBLICATIONS

A Chatterjee et al., "Sub–100nm Gate Length Metal Gate NMOS Transistors Fabricated by a Replacement Gate Process", IEDM Tech. Dig., (1997), pp. 821–824.

* cited by examiner

Primary Examiner—Phat X. Cao
Assistant Examiner—Theresa T. Doan
(74) Attorney, Agent, or Firm—Sughrue Mion, PLLC

(57) ABSTRACT

A metal gate MISFET comprises a metal gate electrode on a semiconductor substrate, a side wall insulation film, and a source-drain region which is formed on the surface of the semiconductor substrate on both sides of the side wall insulation film. Then, a cobalt silicide film is formed on the source-drain region. In this step of manufacturing the MISFET, since the cobalt silicide film is sealed with the silicon nitride film at the time of oxidizing the surface of the substrate of a gate portion, the property of the cobalt silicide film will never be deteriorated. As a consequence, the metal-gate field effect transistor having a low parasitic resistance of the source-drain region can be obtained.

2 Claims, 8 Drawing Sheets

METAL-GATE FIELD EFFECT TRANSISTOR AND METHOD FOR MANUFACTURING THE SAME

This is a divisional of application Ser. No. 09/379,359 (Confirmation No. Not yet assigned) filed Aug. 23, 1999, the disclosure of which is incorporated herein by reference.

BACKGROUND OF THE INVENTION

1. Field of the Invention

The present invention relates to a metal-gate field effect transistor having a low resistance source-drain region and a method for manufacturing the same.

2. Description of the Related Art

A structure of this kind of metal-gate MISFET and a method for manufacturing such a metal-gate MISFET are disclosed in pp. 821–824 of IEDM Tech. Dig., 1997. FIG. 1 is a sectional view showing this conventional metal-gate field effect transistor. FIGS. 2A through 2E are sectional views showing a method for manufacturing the metal-gate field effect transistor in the order of the steps thereof.

As shown in FIG. 2A, after a dummy gate insulation film 6 is formed on a semiconductor substrate 1, a dummy gate electrode 2 is formed by the use of some material. Then, a low concentration source-drain region 5 is formed by means of ion implantation on the surface of the semiconductor substrate 1 by using this dummy gate electrode as a mask. After that, a side wall insulation film 3 is formed on a side wall of the gate electrode 2, and a high concentration source-drain region 4 is formed by means of ion implantation on the surface of the semiconductor substrate 1 by using as a mask this side wall insulation film 3. Incidentally, the gate electrode 2 and the side wall insulation film 3 are embedded in an insulation film 7, and the surface of the gate electrode 2 and the side wall insulation film 3 are made planar.

Subsequently, as shown in FIG. 2B, the dummy gate electrode 2 is removed.

Then, as shown in FIG. 2C, the gate insulation film 6 located below the gate electrode is removed.

Furthermore, as shown in FIG. 2D, the surface of the semiconductor substrate of the gate portion is subjected to oxidation thereby forming a gate insulation film 8.

After that, as shown in FIG. 2E, a metal film is formed on the whole surface of the semiconductor substrate 1 to embed the gate portion with this metal film followed by patterning this metal film with a photo-resist 10 thereby forming a metal-gate electrode 9 which is embedded in the gate portion.

Then, a metal-gate MISFET having a structure shown in FIG. 1 is formed by removing the photo-resist 10.

In this manner, conventionally, in the case where this kind of metal-gate MISFET is manufactured, the MISFET structure is formed in advance by using some material as the gate electrode 2 in order to form in self-alignment the gate electrode and the source-drain region. In the foregoing steps, after this dummy gate electrode 2 is removed, and the dummy gate insulation film 6 located below the dummy gate electrode 2 is removed, the gate oxidation is performed, and the metal is embedded therein to form a real metal-gate electrode 9.

However, this conventional metal-gate MISFET has a problem that a parasitic resistance of the source-drain region is large.

Supposing that a silicide film is formed on the source-drain region of the metal-gate field effect transistor as can be seen in the present invention, the parasitic resistance of the source-drain region can be lowered. However, in the conventional method, such a silicide film can not be formed on the source-drain region.

In other words, in the conventional method, when the metal-made gate electrode is formed followed by implanting ions to form the source-drain region by using the metal-made gate electrode as a mask for self-alignment, it is required to regulate a temperature for activating implanted ions to at most 800° C. or so in order to avoid the melting of the metal. However, the activation of the implanted ions becomes insufficient at such a temperature of heat treatment. Besides, after the dummy gate electrode and the gate insulation film are removed, the presence of the silicide film on the source-drain region at the time of the gate oxidation leads to the deterioration of the electric characteristics owing to the oxidation of the silicide film. For such a reason, the silicide film could not be formed on the source-drain region of the conventional metal-gate MISFET.

SUMMARY OF THE INVENTION

An object of the present invention is to provide a metal-gate field effect transistor having a low parasitic resistance of the source and drain and a method for manufacturing the same.

A metal-gate field effect transistor according to a first aspect of the present invention comprises a metal-gate electrode formed on a semiconductor substrate, and a source-drain region formed on the surface of the semiconductor substrate on both sides of the metal-gate electrode, the transistor being characterized in that a cobalt silicide film is formed on the source-drain region.

A metal-gate field effect transistor according to a second aspect of the present invention comprises a metal-gate electrode formed on a semiconductor substrate, and a source-drain region formed on the surface of the semiconductor substrate on both sides of the metal-gate electrode, the transistor being characterized in that a conductive film formed of the same material as the metal-gate electrode is formed on the source-drain region.

A method for forming the metal-gate field effect transistor according to the first aspect of the present invention comprises the steps of:

forming a source-drain region of the surface of the semiconductor substrate, a dummy gate electrode and a dummy gate insulation film on the semiconductor substrate, and a silicide film on the source-drain region;

forming a sealing film such as silicon nitride or the like on the silicide film;

removing the dummy electrode and the dummy gate insulation film;

subjecting to oxidation the surface of the semiconductor substrate of the gate portion to form a gate oxide film; and embedding a metal material in the gate portion to form the metal-gate electrode.

A method for manufacturing the metal-gate field effect transistor according to the second aspect of the present invention comprises the steps of:

forming a source-drain region of the surface of a semiconductor substrate, and a dummy gate electrode and a dummy gate insulation film on the semiconductor substrate;

removing the dummy gate electrode and the dummy gate insulation film;

subjecting to oxidation the surface of the substrate of the gate portion to form a gate oxide film;

depositing a titanium nitride film;

opening a region including at least a portion of an area on the source-drain region;

depositing a barrier metal film; and simultaneously embedding the gate portion and the opening on the source-drain region to form the metal-gate electrode.

A method for manufacturing the metal-gate field effect transistor according to a third aspect of the present invention comprises the steps of:

forming the source-drain region of the surface of the semiconductor substrate, and a dummy gate electrode, a dummy gate insulation film and a silicon dioxide film on the semiconductor substrate;

forming a first sealing film such as silicon nitride or the like on the dummy gate electrode;

etching in self-alignment the silicon dioxide film on the source-drain region with respect to the gate electrode by using as a mask the side wall insulation film and the sealing film;

embedding an opening on the source-drain region with a metal to form a conductive film;

forming a second sealing film such as silicon nitride or the like on the surface of this conductive film;

exposing the surface of the dummy gate electrode;

removing the dummy gate electrode and the dummy gate insulation film and subjecting to oxidation the surface of the semiconductor substrate of the gate portion thereby forming a gate oxide film and embedding the gate portion with a metal to form a metal-gate electrode.

According to the present invention, since an upper portion of the silicide film is sealed with the sealing film such as silicon nitride or the like, the silicide film is not exposed to an atmosphere of the oxidation even when the silicide film is exposed to a high temperature with the result that the deterioration of the silicide film can be prevented.

Then, since the silicide film is present on the source-drain region, the parasitic resistance of the source-drain region can be reduced.

Furthermore, in the place of the silicide film, even when the conductive film formed of the same metal material as the gate electrode is formed on the source-drain region, the parasitic resistance of the source-drain region can be reduced.

DESCRIPTION OF THE PREFERRED EMBODIMENTS

Figure 1:
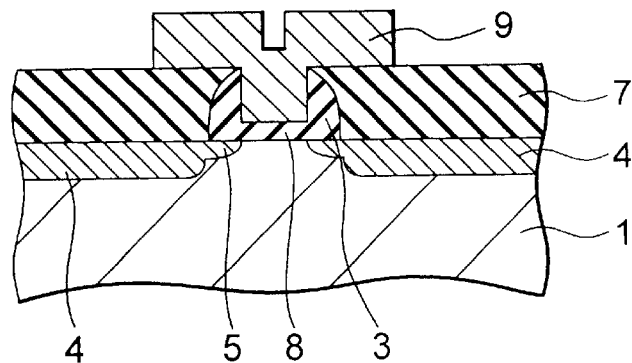
FIG. 1 is a sectional view showing a conventional metal gate MISFET.
Figure 2A:
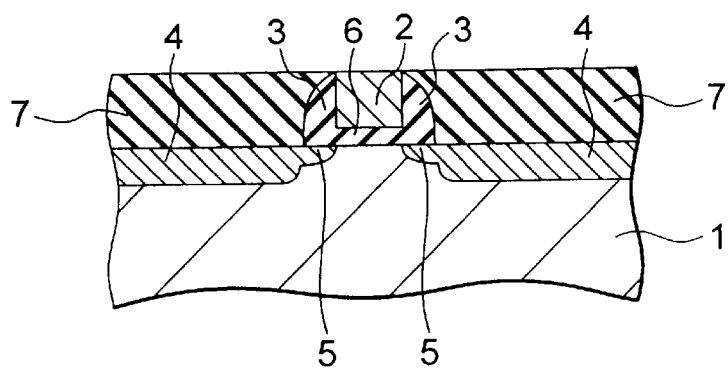
FIGS. 2A through 2E are sectional views showing a method for manufacturing this conventional metal gate MISFET in the order of the steps thereof.
Figure 2B:
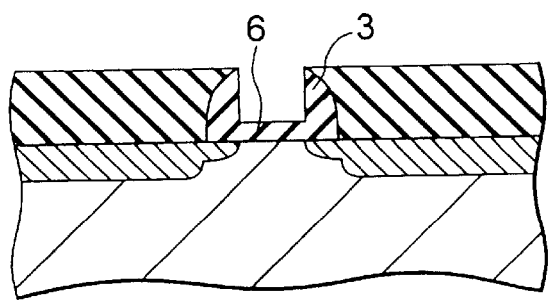
Figure 2C:
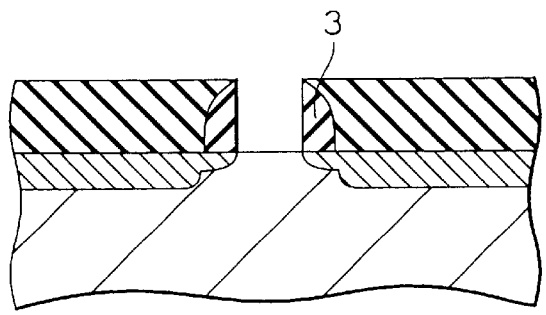
Figure 2D:
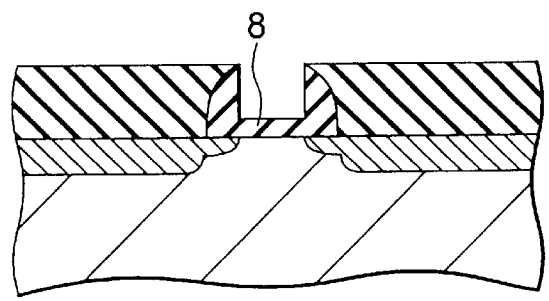
Figure 2E:
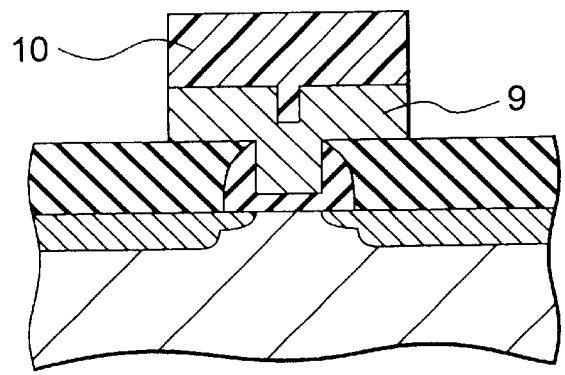
Figure 3:
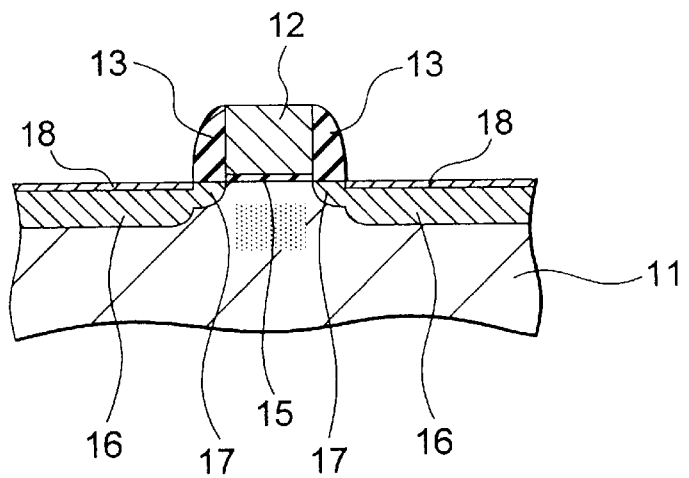
FIG. 3 is a sectional view showing a metal gate MISFET according to a first embodiment of the present invention.

Hereinafter, preferred embodiments of the present invention will be specifically explained by referring to the accompanied drawings. FIG. 3 is a sectional view showing a metal gate MISFET according to an embodiment of the present invention. FIGS. 4A through 4E are sectional views showing a method for manufacturing this metal gate MISFET in the order of the steps thereof. A metal-gate electrode 12 formed of a metal material such as tungsten W or the like is formed via a gate insulation film 15 on a semiconductor substrate 11. On both sides of this metal gate electrode 12, a side wall insulation film 13 is formed. Then, on the surface of the semiconductor substrate 11, a low concentration source-drain region 17 is formed below the side wall insulation film 13. Furthermore, outside of the low concentration source-drain region 17, a high concentration source-drain region 16 is formed. Then, in this embodiment, the surface of the source-drain region which surface is not covered with the side wall insulation film 13 is covered with a silicide film 18. This silicide film 18 is, for example, a cobalt silicide film.

Figure 4A:
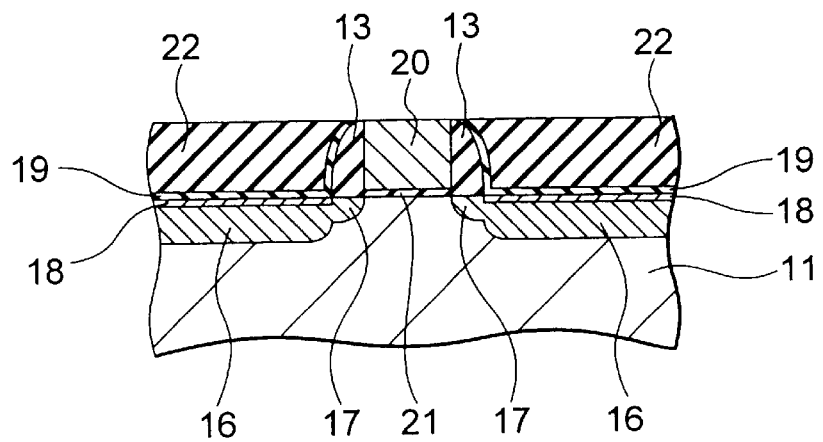
FIGS. 4A through 4E are sectional views showing a method for manufacturing the metal gate MISFET according to the first embodiment of the present invention in the order of the steps thereof.

Subsequently, a method for manufacturing the metal gate MISFET having the above structure will be explained. As shown in FIG. 4A, on the surface of the semiconductor substrate 11, a dummy gate insulation film 21 is formed. Furthermore, a dummy gate electrode 20 formed of polysilicon or the like is selectively formed, and the side wall insulation film 13 is formed on the side wall of the dummy gate electrode 20. This side wall insulation film 13 can be formed of silicon nitride or the like.

In this manner, a MISFET structure by means of the dummy gate electrode is formed. Then, on a high concentration source-drain region 16 which is not covered with the side wall insulation film 13 out of the source-drain region, the cobalt silicide film 18 having, for example, a thickness of 39 nm is formed. Furthermore, the whole surface of the cobalt silicide film 18 is covered with a silicon nitride film 19 having, for example, a thickness of 100 nm. Furthermore, in order to make planar the surface of the device, a thick insulation film 22 is formed thereon. After that, the insulation film 22 and the silicon nitride film 19 on the dummy gate electrode 20 are selectively removed with the chemical and mechanical polishing method (CMP) to make planar the surface thereof. As a consequence, the surface of the dummy gate electrode 20 is exposed. As the thick insulation film 22 which is used at this step, a silicon oxide film is generally used.

Figure 4B:
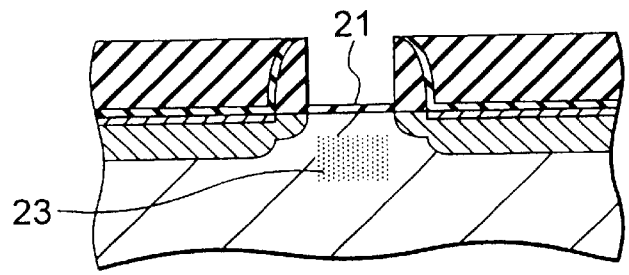

Subsequently, as shown in FIG. 4B, the dummy gate electrode 20 is removed. Then, on the surface of the semiconductor substrate 11 of this gate portion, ion implantation 23 is performed for determining a punch-through stopper and a threshold value Vt. As ion seeds for determining this threshold value Vt, boron is generally used in the case of nMOSFET, and phosphorus is generally used in the case of pMOSFET. There is a case in which other kind of ions are used depending on the manufacturing steps. The present embodiment is not limited to the above kind of ions.

Figure 4C:
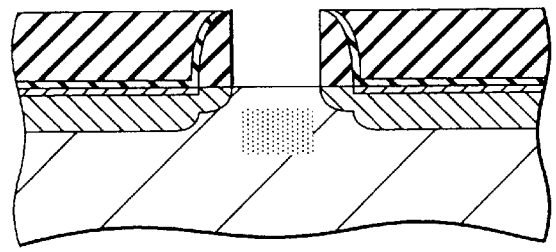

After that, as shown in FIG. 4C, the dummy gate insulation film 21 is removed.

Figure 4D:
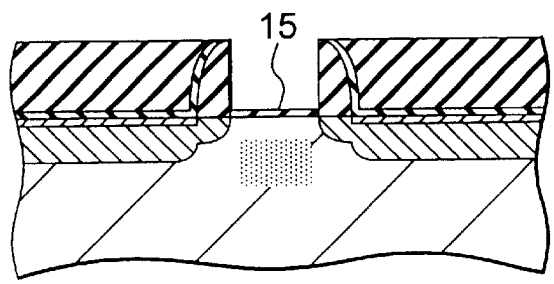
Figure 4E:
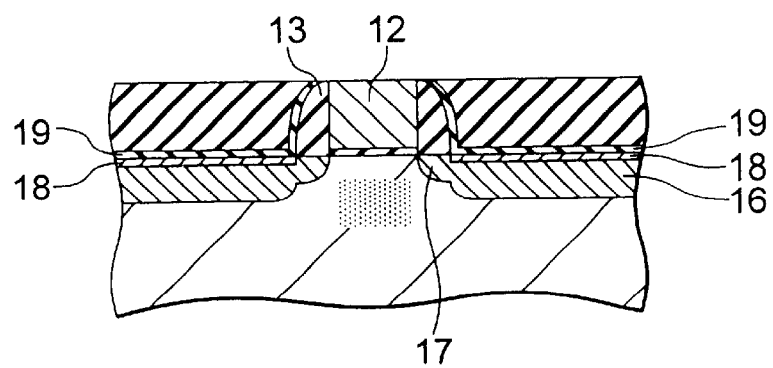

Subsequently, as shown in FIG. 4D, the gate insulation film (oxide film) 15 is formed on the surface of the semiconductor substrate of the gate portion by subjecting to oxidation the surface of the semiconductor substrate in the oxidation atmosphere at a temperature of, for example, 700° C.

After that, a metal film such as tungsten W or the like is formed on the whole surface of the semiconductor substrate 11, a metal film is embedded in the gate portion, and the metal film is polished with the chemical and mechanical polishing method (CMP) thereby exposing the surface of the metal gate electrode 12 and completing the metal gate MISFET.

In the present embodiment, at the step of gate oxidation (FIG. 4D), the cobalt silicide film 18 is sealed with the silicon nitride film 19 so that the cobalt silicide film 18 is not exposed to the oxidation atmosphere and the characteristics thereof is not deteriorated. In the absence of this silicon nitride film 19, the cobalt silicide film 18 is only covered with the insulation film 22, and a silicon oxide film is normally used in this insulation film 22 as described above. Since this silicon oxide allows the passage of the oxidation seeds, the oxidation of the silicide film 18 cannot be prevented. On the other hand, since the silicon nitride film 19 in the present embodiment does not allow the passage of the oxidation seeds, the oxidation of the silicide film 18 can be prevented.

As a consequence, even when the silicide film 18 is exposed to a high temperature in the gate oxidation treatment, the silicide film 18 is not exposed to the oxidation atmosphere with the result that the deterioration of the silicide film 18 can be prevented. Then, since the silicide film 18 is present on the source-drain region, the parasitic resistance of the source-drain region can be reduced.

Figure 5:
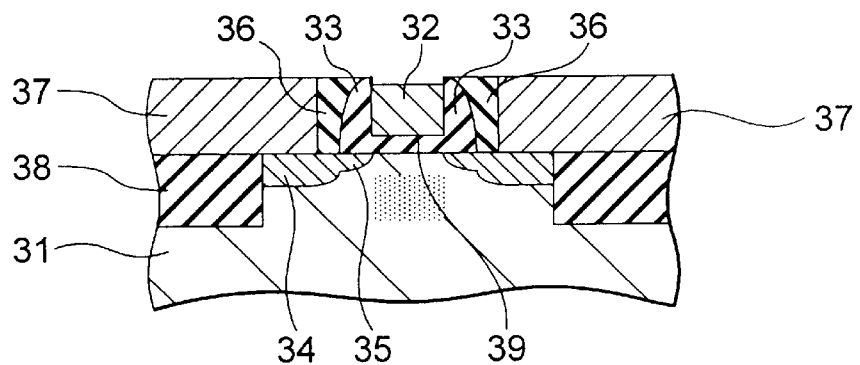
FIG. 5 is a sectional view showing the metal gate MISFET according to a second embodiment of the present invention.

Subsequently, a second embodiment of the present invention will be explained. FIG. 5 is a sectional view showing a metal-gate field effect transistor according to the second embodiment of the present invention. FIGS. 6A through 6F are sectional views showing the method for manufacturing the metal-gate field effect transistor according to the second embodiment in the order of the steps. In the second embodiment, on a region surrounded by a device isolation insulation film 38 on the surface of the semiconductor substrate 31, a low concentration source-drain region 35 and a high concentration source-drain region 34 are formed. On an area above a channel region, a metal gate electrode 32 is formed via a gate insulation film 39. On the side wall of the channel region, a side wall insulation film 33 is formed. Outside of each of the side wall insulation films 33, a conductive film 37 is formed via an insulation film 36. This conductive film 37 is formed of the same metal material as the metal gate electrode 32.

In the second embodiment, the silicide film is not present on the source-drain regions 34 and 35. However, the conductive film 37 is present thereon with the result that the parasitic resistance of the source-drain regions 34 and 35 is reduced.

Figure 6A:
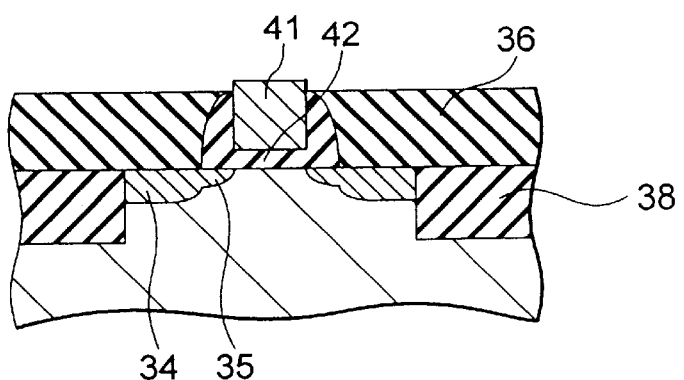
FIGS. 6A through 6F are sectional views showing the method for manufacturing the metal gate MISFET according to the second embodiment of the present invention in the order of the steps thereof.

Subsequently, the method for manufacturing this metal-gate field effect transistor will be explained. In the beginning, as shown in FIG. 6A, a dummy gate electrode 41 and a dummy gate insulation film 42 are formed.

Figure 6B:
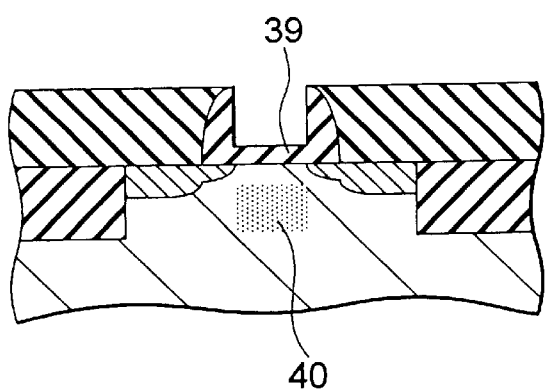

After that, as shown in FIG. 6B, after the dummy gate electrode 41 and the dummy insulation film 42 are removed, ion implantation 40 is performed to form an implantation layer, and the gate oxidation is performed with the result that a gate insulation film (oxide film) 39 is formed.

Figure 6C:
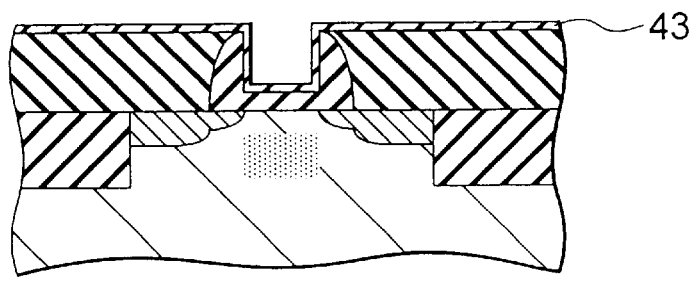
Figure 6D:
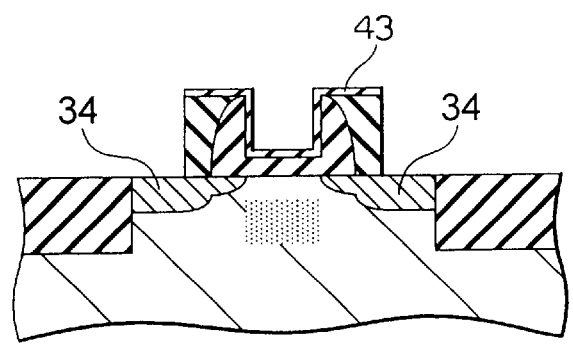

After that, as shown in FIG. 6C, a titanium nitride film 43 is deposited to open a region including at least portion of an area on the source-drain region 34.

Figure 6E:
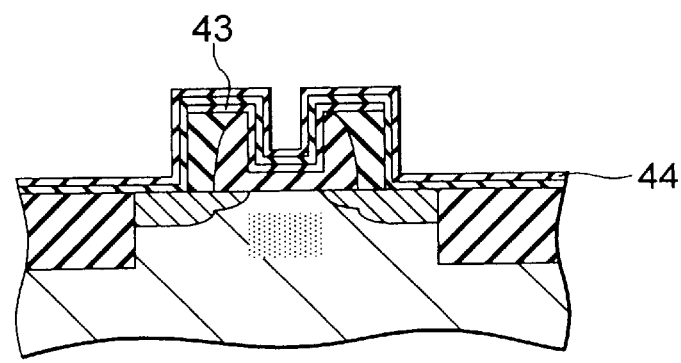

Subsequently, as shown in FIG. 6E, a barrier metal film 44 is deposited. This barrier metal film 44 comprises, for example, a laminated body of a titanium nitride film and a titanium film located below the titanium nitride film. The titanium nitride film is generally used as a barrier film. However, since this titanium nitride film has a poor adhesiveness with the insulation film or the like, the titanium film is used as a close contact layer. However, it goes without saying that the barrier metal film 44 may be used as a single layer.

Figure 6F:
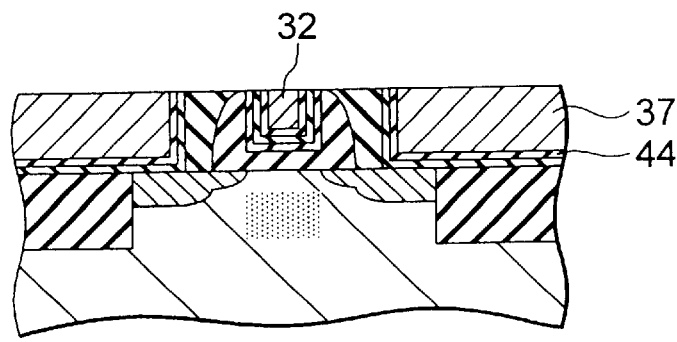

After that, as shown in FIG. 6F, the metal gate electrode 32 and the conductive film 37 are formed by simultaneously embedding the gate electrode region and the opening on the source-drain region with a metal such as tungsten or the like by means of, for example, the CVD or the like, thereby completing the metal gate MISFET.

In this embodiment, the conductive film 37 formed of the same metal material as the gate electrode is formed on the source-drain region at the same step as the gate electrode, the parasitic resistance of the source-drain region can be reduced, and the step thereof is simple, at the same time.

Subsequently, a third embodiment of the present invention will be explained. FIGS. 7A through 7G are sectional views showing the method for manufacturing the metal-gate field effect transistor according to the third embodiment of the present invention in the order of steps. The third embodiment is such that an opening on the source-drain region is formed in self-alignment with respect to a gate electrode.

Figure 7A:
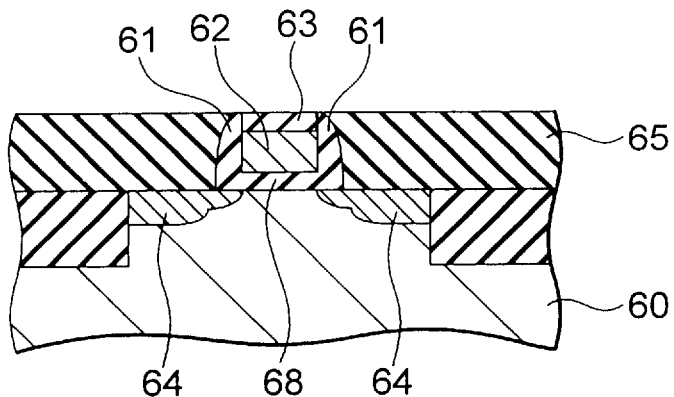
FIGS. 7A through 7G are sectional views showing a method for manufacturing the metal gate MISFET according to a third embodiment of the present invention in the order of the steps thereof.

As shown in FIG. 7A, a dummy gate electrode 62 and a dummy gate insulation film 68 are formed on a semiconductor substrate 60, and a side wall insulation film 61 is formed on the side walls of the dummy gate electrode 62 with silicon nitride, and a silicon nitride cap portion 63 is formed on the dummy gate electrode 62. Furthermore, the source-drain region 64 is formed on the surface of the semiconductor substrate, and an $SiO_2$ film 65 is formed on a region other than the gate portion on the semiconductor substrate.

Figure 7B:
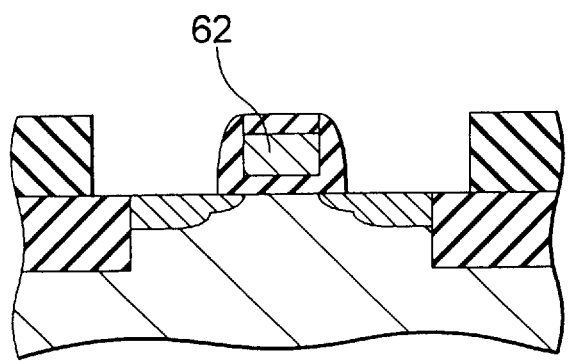

After that, as shown in FIG. 7B, the $SiO_2$ film 65 on the source-drain region 64 is etched and removed by using as a mask the silicon nitride side wall insulation film 61, and the silicon nitride cap portion 63 on the dummy gate electrode 62. As a consequence, an opening on the source-drain region 64 is opened in self-alignment with respect to the gate electrode 63.

Figure 7C:
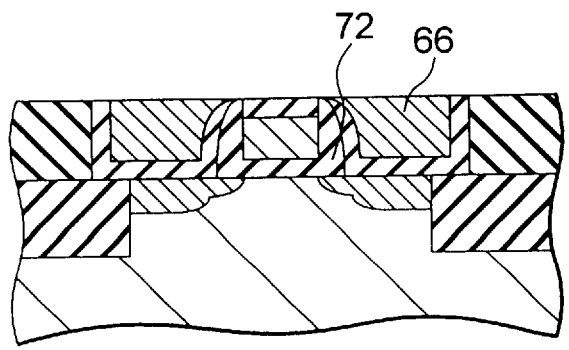
Figure 7D:
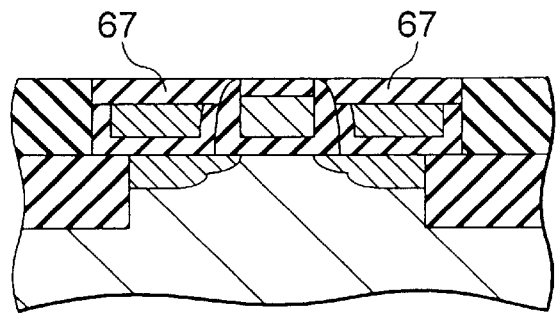

Subsequently, as shown in FIG. 7C, a barrier metal film 72 such as titanium nitride film or the like is formed with respect to the opening on the source-drain region in the beginning. Then, the opening is embedded with a conductive film 66 such as tungsten W or the like. After that, as shown in FIG. 7D, a sealing portion 67 of the silicon nitride sealing portion 67 is formed on the surface of the conductive film 66.

Figure 7E:
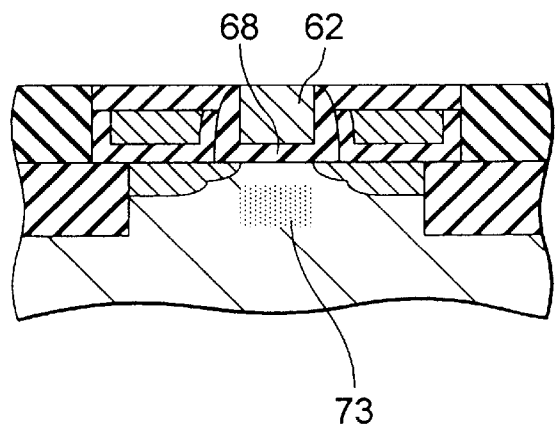

After that, as shown in FIG. 7E, and the surface of the dummy gate electrode 62 is exposed by polishing the surface of the sealing portion 67, the dummy gate electrode 62 is removed, and the dummy gate insulation film 68 is removed, and ion implantation 73 is performed.

Figure 7F:
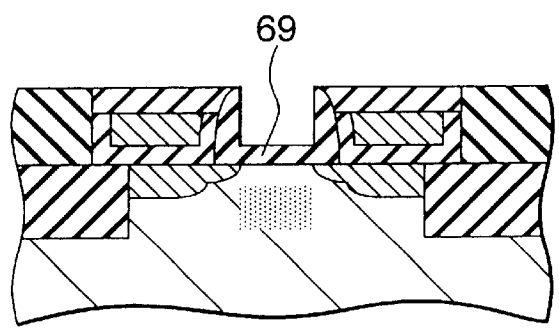

After that, as shown in FIG. 7F, the surface of the semiconductor substrate of the exposed gate portion is subjected to oxidation with the result that a gate oxide film 69 is formed.

Figure 7G:
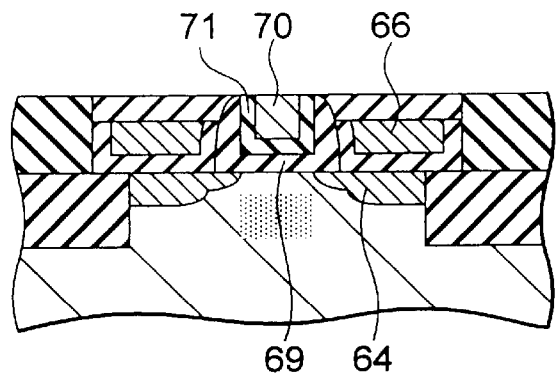

After that, as shown in FIG. 7G, after a barrier metal film 71 covers the gate portion, a metal such as tungsten W or the like is embedded in the gate portion, and a metal gate electrode 70 is formed. As a consequence, a metal gage MISFET is completed. In the third embodiment, the conductive film 66 is formed on the source-drain region 64, the parasitic resistance of the source-drain region 64 can be reduced.

What is claimed is:

1. A method for manufacturing a metal-gate field effect transistor comprising the steps of:

forming a source-drain region of a surface of a semiconductor substrate, and a dummy gate electrode, a dummy gate insulation film and an silicon oxide film on the semiconductor substrate;

forming a first sealing film on the dummy gate electrode;

etching in self-alignment a silicon oxide film on the source-drain region with respect to the gate electrode by using as a mask the side wall insulation film and the sealing film;

embedding an opening on the source-drain region with metal to form a conductive film;

forming a second sealing film on the surface of the conductive film;

exposing the surface of the dummy gate electrode;

removing the dummy gate electrode and the dummy gate insulation film and subjecting to oxidation the surface of the semiconductor substrate of the gate portion thereby forming a gate oxide film and embedding the gate portion to form a metal-gate electrode.

2. A method for manufacturing the metal-gate field effect transistor according to claim 1, wherein the first and the second sealing portions are formed of silicon nitride.

* * * * *